(12) United States Patent
Lee et al.

(10) Patent No.: US 7,978,477 B2
(45) Date of Patent: Jul. 12, 2011

(54) DUAL-CHANNEL OPTICAL NAVIGATION DEVICE

(75) Inventors: Hun Kwang Lee, Simpang Ampat (MY); Yat Kheng Leong, Cheras (MY); Sai Mun Lee, Sg. Nibong (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 712 days.

(21) Appl. No.: 12/117,775

(22) Filed: May 9, 2008

(65) Prior Publication Data

US 2009/0279270 A1    Nov. 12, 2009

(51) Int. Cl.
*H05K 5/00* (2006.01)
*H05K 7/00* (2006.01)
*G09G 5/08* (2006.01)

(52) U.S. Cl. ......... 361/758; 361/760; 345/163; 345/166

(58) Field of Classification Search .................. 361/760, 361/783, 796, 802; 345/163, 166
See application file for complete search history.

(56) References Cited

U.S. PATENT DOCUMENTS

| | | | |
|---|---|---|---|
| 5,786,804 A | 7/1998 | Gordon | |
| 2005/0093825 A1* | 5/2005 | Chang et al. | 345/166 |
| 2005/0186710 A1* | 8/2005 | Moyer et al. | 438/116 |
| 2005/0205677 A1* | 9/2005 | Patel et al. | 235/454 |
| 2005/0253058 A1* | 11/2005 | Leong et al. | 250/239 |
| 2006/0187209 A1* | 8/2006 | Lai et al. | 345/166 |
| 2006/0255152 A1* | 11/2006 | Xie et al. | 235/472.01 |
| 2007/0176081 A1* | 8/2007 | Stricklin | 250/214 AL |

OTHER PUBLICATIONS

Avago Technologies, "ADNS-3060, High-performance Optical Mouse Sensor", Jan. 2007, p. 1-38.
Agilent Technologies, "ADNK-3061, Optical Mouse Designer's Kit", Nov. 8, 2004, p. 1-4.
Avago Technologies, "ADNS-3060, Optical Mouse Sensor", Sep. 16, 2006, p. 1-3.

* cited by examiner

*Primary Examiner* — William H Mayo, III
*Assistant Examiner* — Sherman Ng

(57) ABSTRACT

A dual-channel optical navigation system with vertically aligned sensors. The dual-channel optical navigation system includes a circuit board, a contact navigation sensor, and a free-space navigation sensor. The circuit board mechanically supports and electrically connects multiple navigation sensors on opposing sides of the circuit board. The contact navigation sensor is coupled to a first side of the circuit board. The contact navigation sensor generates a contact navigation signal based on contact navigation images of a contact navigation surface approximately adjacent to the dual-channel optical navigation system. The free-space navigation sensor is coupled to a second side of the circuit board. The free-space navigation sensor generates a free-space navigation signal based on free-space navigation images of an operating environment of the dual-channel optical navigation system.

20 Claims, 5 Drawing Sheets

DUAL-CHANNEL OPTICAL NAVIGATION DEVICE

BACKGROUND OF THE INVENTION

An optical navigation device is used to track the relative motion of a surface or object. Optical navigation is done by illuminating the surface or object and tracking its motion by analyzing the difference of two images recorded by an image sensor over a relatively short time frame. This concept can be witnessed, for example, in an optical computer mouse. As the mouse is moved across a tabletop or other surface, the relative motion is tracked and a navigation signal is generated.

FIG. 1 depicts a conventional optical navigation system 10. In particular, the optical navigation system 10 is a contact optical navigation system. The navigation system 10 includes a light source 12, a lens 14, and a sensor package 16. The light source 12, which generates light, is oriented at an angle with respect to a navigation surface 18. The light that is emitted by the light source 12 is directed through the lens 14 to the navigation surface 18. The navigation surface 16 reflects the light back through the lens 14 and into the sensor package 16. The angular configuration of the optical navigation system 10 to achieve reflection of the light on the navigation surface 16 consumes space and restricts the ability to incorporate the system in various spatially-constrained applications. This configuration of the conventional optical navigation system 10 also confines the optical navigation system 10 to contact navigation applications in close proximity to the navigation surface 18.

SUMMARY OF THE INVENTION

Embodiments of a system are described. In one embodiment, the system is a dual-channel optical navigation system. One embodiment of the dual-channel optical navigation system includes a circuit board, a contact navigation sensor, and a free-space navigation sensor. The circuit board mechanically supports and electrically connects multiple navigation sensors on opposing sides of the circuit board. The contact navigation sensor is coupled to a first side of the circuit board. The contact navigation sensor generates a contact navigation signal based on contact navigation images of a contact navigation surface approximately adjacent to the dual-channel optical navigation system. The free-space navigation sensor is coupled to a second side of the circuit board. The free-space navigation sensor generates a free-space navigation signal based on free-space navigation images of an operating environment of the dual-channel optical navigation system. Other embodiments of the system are also described.

Embodiments of an apparatus are also described. In one embodiment, the apparatus is an optical navigation device. The optical navigation device includes a circuit board, a contact navigation sensor, a light source, and a light pipe. The circuit board mechanically supports and electrically connects multiple navigation sensors on opposing sides of the circuit board. The contact navigation sensor is coupled to a first side of the circuit board. The contact navigation sensor generates a contact navigation signal based on contact navigation images of a contact navigation surface approximately adjacent to the optical navigation device. The light source is also coupled to the first side of the circuit board. The light source illuminates the contact navigation surface. The light pipe transmits the light from the light source to the contact navigation surface and directs reflected light from the contact navigation surface to the contact navigation sensor. Other embodiments of the apparatus are also described.

Embodiments of a method are also described. In one embodiment, the method is a method of making a dual-channel optical navigation system. The method includes mounting a contact navigation sensor to a first side of a circuit board. The contact navigation sensor generates a contact navigation signal in a contact operation mode. The method also includes mounting a light pipe to the first side of the circuit board. The light pipe redirects light from a contact navigation surface approximately 90 degrees toward the contact navigation sensor. The method also includes mounting a free-space navigation sensor to a second side of the circuit board. The free-space navigation sensor generates a free-space navigation signal in a free-space operation mode. Other embodiments of the method are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

FIG. 2b depicts an exploded view of another embodiment of the dual-channel optical navigation system of FIG. 2a.

FIG. 3 depicts a cross-sectional view of another embodiment of the dual-channel optical navigation system of FIG. 2a.

Throughout the description, similar reference numbers may be used to identify similar elements.

DETAILED DESCRIPTION

Figure 2A:
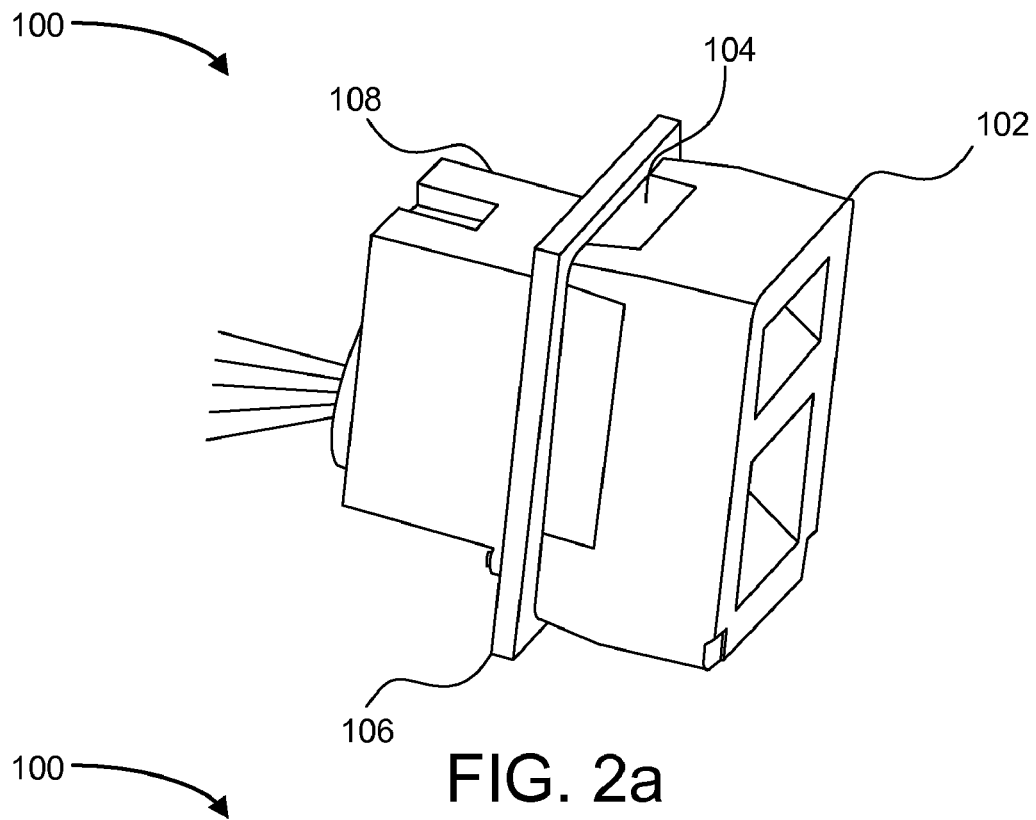
FIG. 2a depicts a schematic diagram of one embodiment of a dual-channel optical navigation system.

FIG. 2a depicts a schematic diagram of one embodiment of a dual-channel optical navigation system 100. As depicted in FIG. 2a, the dual channel optical navigation system 100 includes a light pipe 102, a spacer 104, a circuit board 106, and a protective housing 108. The light pipe 102 may be made of glass, plastic, or other light transmitting material. The light pipe 102 is mounted to the circuit board 106 over the spacer 104. The spacer 104 is also mounted to the circuit board 106. The protective housing 108 is mounted to the opposite side of the circuit board 106. In one embodiment, the components are bonded to the circuit board 106 using adhesive. In another embodiment, the components are joined using fasteners. Although certain component parts are shown in conjunction with the optical navigation system 100 of FIG. 2a, other embodiments may include fewer or more component parts, or equivalent parts to perform fewer or more contact navigation and free-space navigation functions. Additionally, while the components of the optical navigation system 100 are shown in FIG. 2a as being separate components, some of these components may be integrated. In some embodiments, every component of the optical navigation system 100 may be integrated.

Figure 2B:
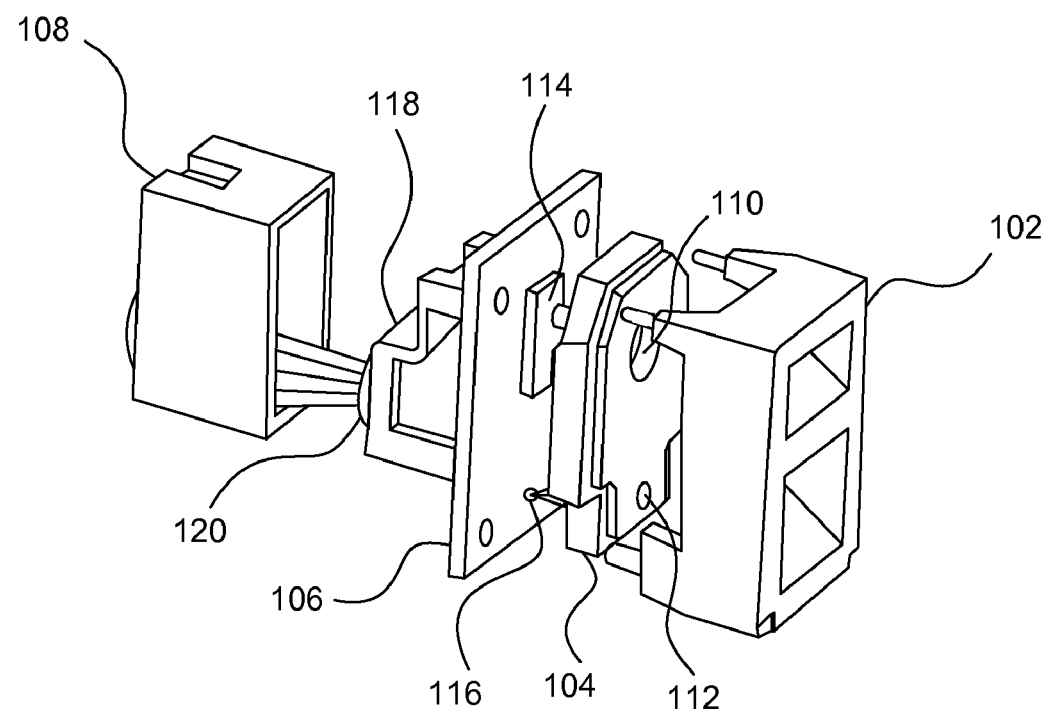

FIG. 2b depicts an exploded view of another embodiment of the dual-channel optical navigation system of FIG. 2a. As illustrated in FIG. 2b, the dual-channel optical navigation system 100 includes the light pipe 102, the spacer 104, a contact navigation channel aperture 110, a light source channel aperture 112, the circuit board 106, a light source 116, a contact navigation sensor 114, a free-space lens structure 118, a free-space navigation lens 120, and the protective housing 108.

In one embodiment, the contact navigation channel aperture 110 is positioned to allow light to fall incident on the contact navigation sensor 114. In one embodiment, the contact navigation channel aperture 110 may be round in geometry. In other embodiments, the contact channel aperture 110 may have a geometry to produce an optical stop effect to eliminate aberrations in the light which passes to the contact navigation sensor 114. In one embodiment, the contact navigation channel aperture 110 may be made of light transmissive material, for example, glass or plastic. Alternatively, the contact navigation channel aperture 110 may be an air gap through the spacer 104.

The depicted light source channel aperture 112 is configured to pass light from the light source 116 into the light pipe 102. In one embodiment, the light source channel aperture 112 may be made of light transmissive material. Alternatively, the light source channel aperture 112 may be an air gap through the spacer 104. In one embodiment, the light source channel aperture 112 may be configured to allow a percentage of the light from the light source 116 to pass into the light pipe 102. In another embodiment the light source channel aperture 112 may be configured to direct all or substantially all of the light from the light source 116 into the light pipe 102.

The contact navigation sensor 114 of FIG. 2b is depicted on the surface of the circuit board 106. In one embodiment, the contact navigation sensor 114 is bonded to the circuit board 106. In some embodiments, the contact navigation sensor 114 receives light and generates a contact navigation signal corresponding to the received light. In one embodiment, the contact navigation sensor 114 is a complementary metal-oxide semiconductor (CMOS) class sensor. In some embodiments, the light source 116 is coupled to the circuit board 106. The light source 116 is configured to generate light. In some embodiments, the light source 116 is configured to generate light of a certain wavelength or range of wavelengths. In one embodiment, the light source 116 is a light-emitting diode (LED). In another embodiment the light source 116 is a vertical cell surface-emitting laser (VCSEL). Other embodiments may implement other types of light sources.

The free-space lens structure 118 of FIG. 2b includes the free-space navigation lens 120. In one embodiment, the free-space lens structure 118 mechanically supports the free-space navigation lens 120. In another embodiment, the free-space lens structure 118 and the free-space navigation lens 120 are integrated in a unitary structure. The free-space navigation lens 120 is made of glass, plastic, or other light transmitting material. The free-space navigation lens 120 may have different geometries to apply different optical effects to the light incident on the surface of the free-space navigation lens 120. In general, the free-space navigation lens 120 collects incident ambient light and directs it towards a free-space navigation sensor 122 (see FIG. 3).

Figure 3:
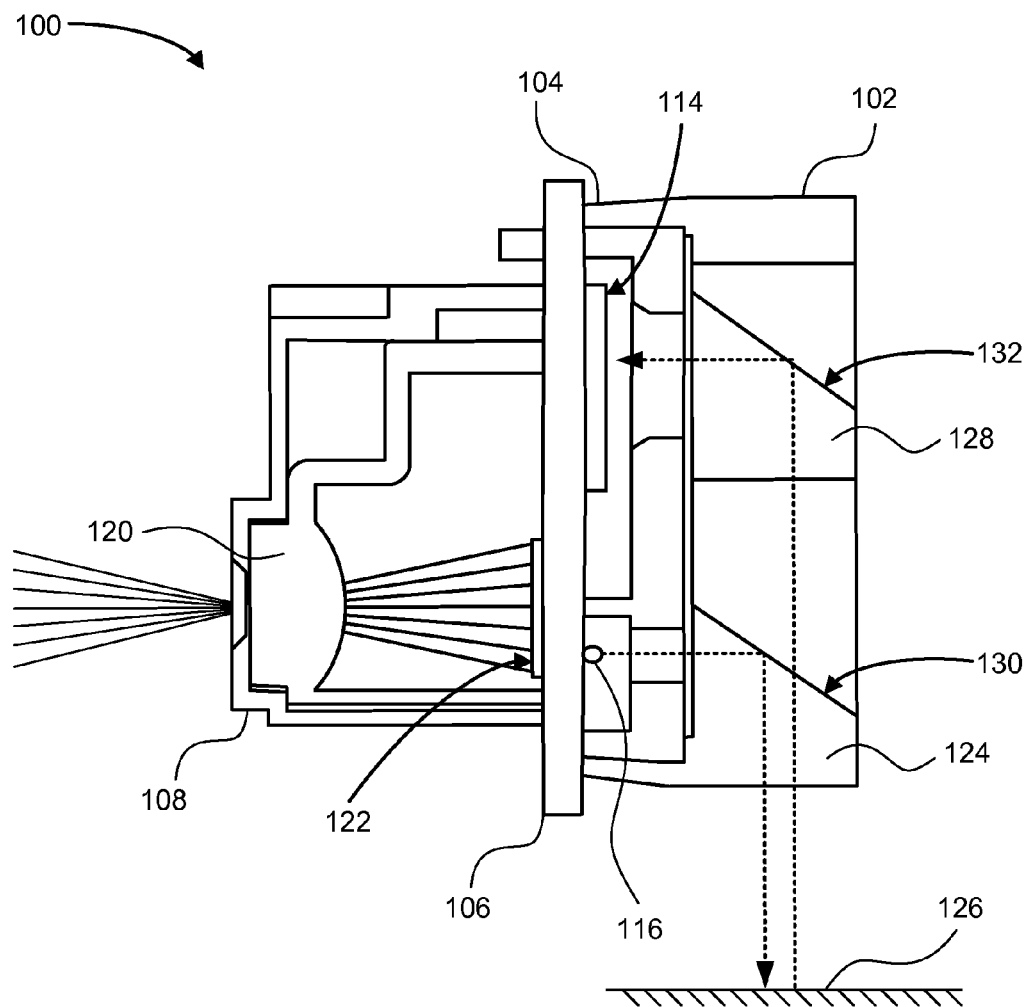

FIG. 3 depicts a cross-sectional view of another embodiment of the dual-channel optical navigation system 100 of FIG. 2a. The dual-channel optical navigation system 100 depicted in FIG. 3 is positioned relative to a contact navigation surface 126. The dual-channel optical navigation system 100 includes the light pipe 102, the spacer 104, the circuit board 106, and the protective housing 108. The light pipe 102 includes a first lens portion 124 and a second lens portion 128. Each of the lens portions 124 and 128 includes a corresponding reflective surface, namely the first reflective surface 130 and the second reflective surface 132, respectively.

In one embodiment, the dual-channel optical navigation system 100 is used in a contact navigation operating mode. In some embodiments, light from the light source 116 passes through the light source channel aperture 112 (see FIG. 2b) and enters the first lens portion 124 of the light pipe 102. The light is then reflected off the first reflective surface 130 and is directed by the first lens portion 124 towards the contact navigation surface 126. The light is reflected off the contact navigation surface 126 and transmitted by the first lens portion 124 to the second lens portion 128. In some embodiments, the first reflective surface 130 is oriented to provide total internal reflection of the light from the light source 116. In some embodiments, the first lens portion 124 directs the reflected light from the contact navigation surface 126 and refracts the light toward the second lens portion 128. The light from the contact navigation surface 126 is then reflected by the second reflective surface 132 of the second lens portion 128. In some embodiments, the reflected light from the contact navigation surface 126 undergoes total internal reflection at the second reflective surface 132 of the second lens portion 128. The second lens portion 128 directs the light through the contact navigation channel aperture 110 (see FIG. 2b). The light is then detected by the contact navigation sensor 114.

In one embodiment the first reflective surface 130 is oriented to cause total internal reflection of the light generated by the light source 116. For example, in an embodiment, the orientation angle for the first and second reflective surfaces 130 and 132 is about 45 degrees. In some embodiments, the first reflective surface 130 and the second reflective surface 132 are parallel.

In some embodiments, the dual-channel optical navigation system 100 of FIG. 3 is used in a free-space navigation operating mode. In some embodiments, the protective housing 108 encloses the free-space navigation lens 120. The free-space navigation lens 120 gathers light from an object or surface and generates a corresponding free-space navigation signal. The light is directed by the free-space navigation lens 120 to the free-space navigation sensor 122. In one embodiment, the free-space navigation lens 120 applies a convergence factor to the light. In another embodiment, the free-space navigation lens 120 applies a magnification factor to the light incident on the free-space navigation sensor 122. In one embodiment the free-space navigation lens 120 includes multiple optical lenses to apply an optical effect to the light.

Figure 1:
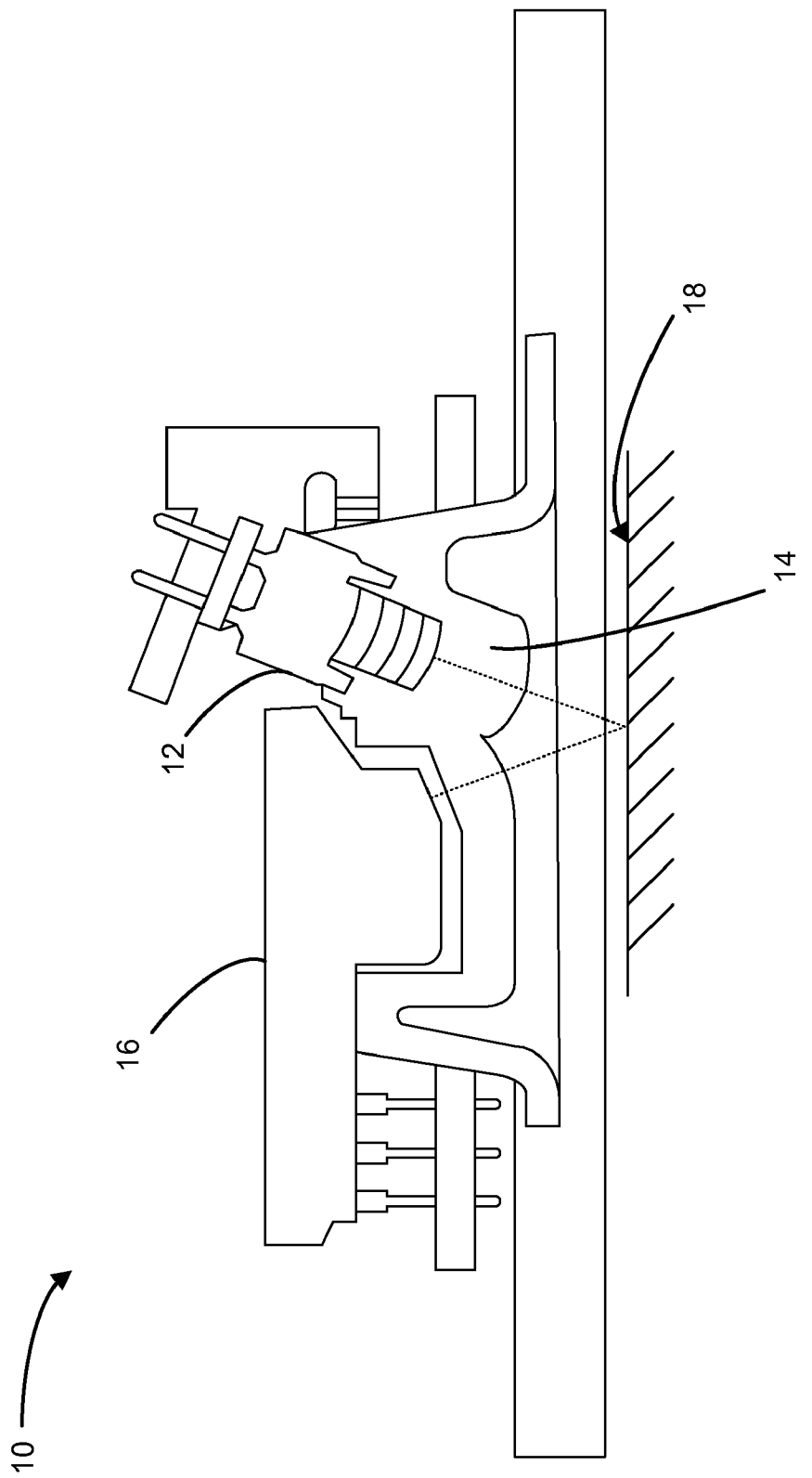
FIG. 1 depicts a cross-sectional view of a conventional optical navigation system.

In one embodiment, the free-space navigation sensor 122 and the contact navigation sensor 114 are mounted to opposite sides of the circuit board 106. In this way, the free-space navigation sensor 122 and the contact navigation sensor 114 face opposite directions. In one embodiment, the circuit board 106 is oriented substantially perpendicular to the navigation surface 126. In one embodiment, the vertical orientation of the circuit board 106 reduces, minimizes, or eliminates the horizontal distance between illumination and imaging channels because the light incident on the contact navigation surface 126 travels through the same vertical light pipe 102. Embodiments of this vertical orientation also reduce, minimize, or eliminate illumination angles and imaging angles depicted in FIG. 1.

Figure 4:
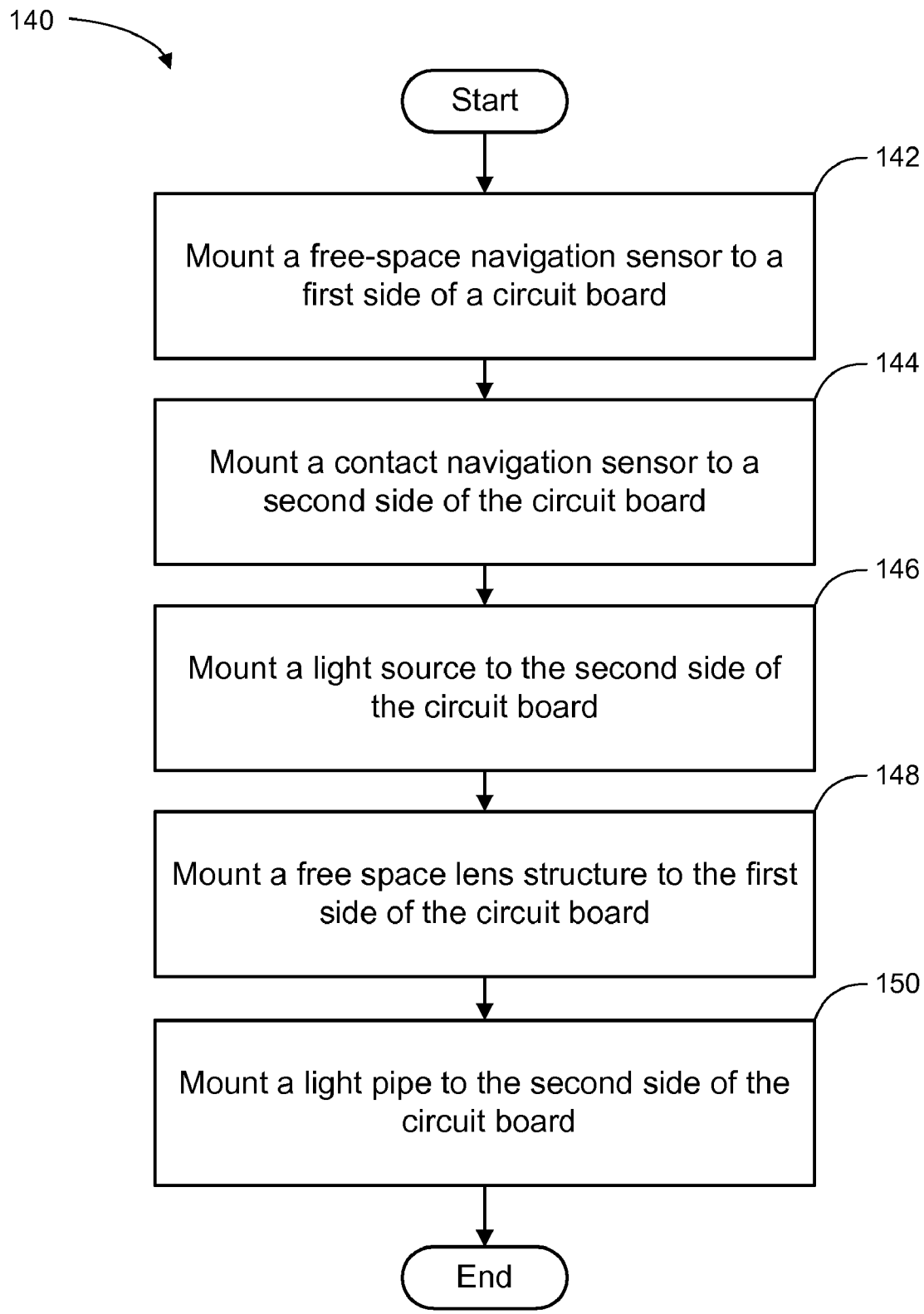
FIG. 4 depicts a schematic flow chart diagram of one embodiment of a method of making a dual-channel optical navigation system.

FIG. 4 depicts a schematic flow chart diagram of one embodiment of a method of making a dual-channel optical navigation system. Although the method 140 is described in conjunction with the dual-channel optical navigation system 100, other embodiments may be implemented with other types of optical navigation devices.

At block 142, the method 140 includes mounting a free-space navigation sensor 122 to a first side of a circuit board 106. In one embodiment the free-space navigation sensor 122 is a pre-packaged integrated circuit (IC) bonded to the circuit board 106. In another embodiment, the free-space navigation sensor 122 is a bare IC die bonded to the circuit board 106. At block 144, the method 140 includes mounting a contact navigation sensor 114 to a second side of the circuit board 106. In one embodiment, the contact navigation sensor 114 is a pre-packaged IC bonded to the circuit board 106. In another embodiment, the contact navigation sensor 114 is a bare IC die bonded to the circuit board 106. At block 146, the method 140 includes mounting a light source 116 to the second side of the circuit board 106. In one embodiment, the light source 116 is a LED. In another embodiment, the light source 116 is a VCSEL.

At block 148, the method 140 includes mounting a free-space lens structure 118 to the first side of the circuit board 106. In one embodiment, the free-space lens structure 118 includes the free-space navigation lens 120. In some embodiments, the free-space lens structure 118 and the free-space navigation lens 120 are integrated in a unitary structure. At block 150, the method 140 includes mounting a light pipe 102 to the second side of the circuit board 106. In some embodiments, the light pipe 102 is separated from the circuit board 106 by a spacer 104. In one embodiment, the spacer 104 and the light pipe 102 are integrated in a unified structure.

Figure 5:
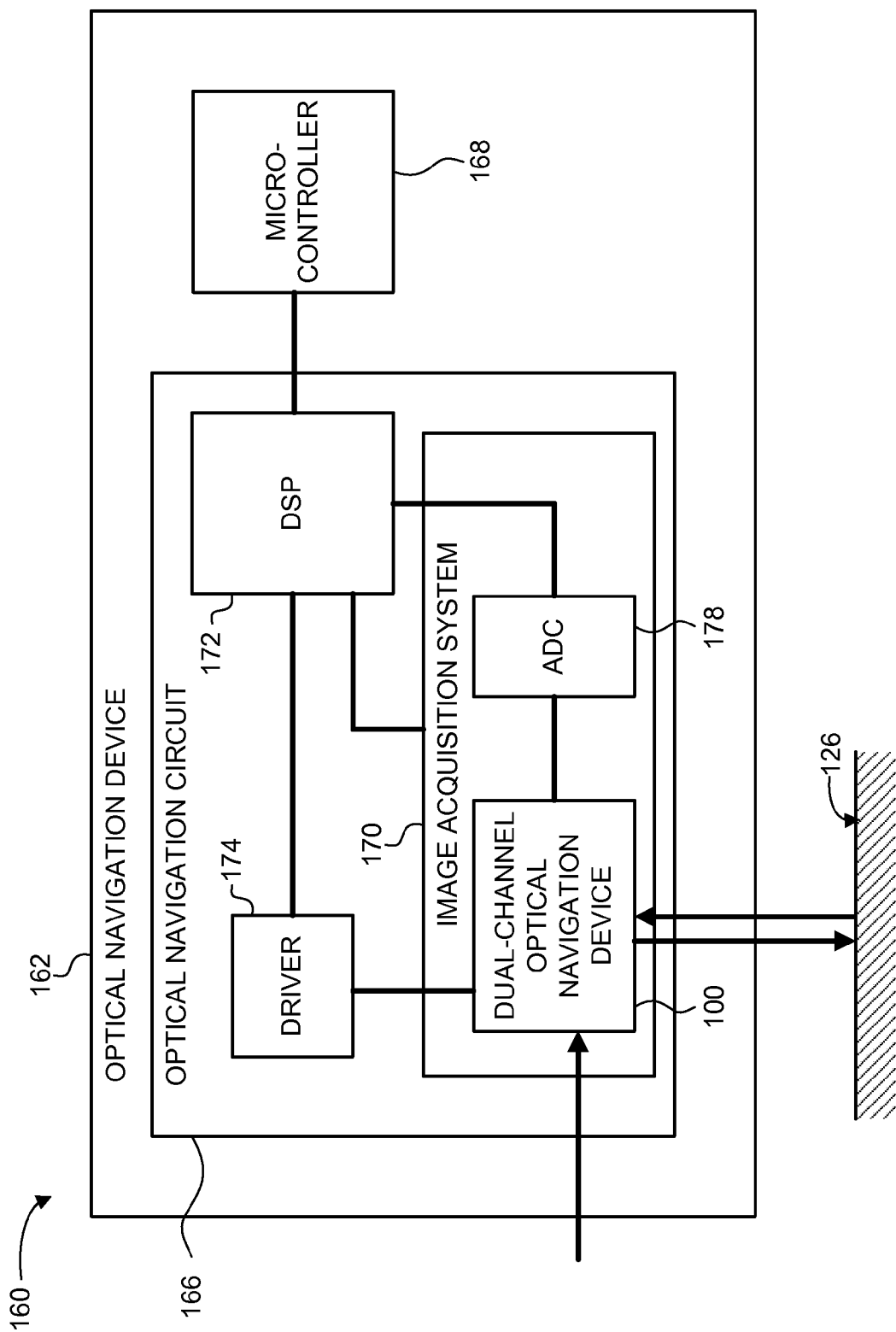
FIG. 5 depicts a schematic block diagram of one embodiment of a dual-channel optical navigation system.

FIG. 5 depicts a schematic block diagram of one embodiment of an optical navigation system 160. The illustrated optical navigation system 160 includes an optical navigation device 162 and a contact navigation surface 126. The optical navigation device 162 emits a light signal which is at least partially reflected by the contact navigation surface 126. The optical navigation device 162 detects the reflected light signal and processes the reflected light signal, as described below.

It should be noted that the distance between the optical navigation device 162 and the contact navigation surface 126 may vary depending on the application for which the optical navigation device 162 is used. In contact navigation operating mode, the optical navigation device 162 may be relatively close to the contact navigation surface 126. For example, the optical navigation device 162 may be in physical contact with the contact navigation surface 126, or the optical navigation device 162 may be within a few centimeters or inches of the contact navigation surface 126. Alternatively, in free-space operating mode, the optical navigation device 162 may be relatively far from the contact navigation surface 126. For example, the optical navigation device 162 may operate outside of the free-space optical range.

The depicted optical navigation device 162 includes an optical navigation circuit 166 and a microcontroller 168. Other embodiments may include fewer or more components.

The depicted optical navigation circuit 166 includes an image acquisition system (IAS) 170, a digital signal processor (DSP) 172, and a driver 174. In one embodiment, the driver 174 of the optical navigation circuit 166 controls the operation of the light source 116 (see FIG. 3) to generate the light signal that is transmitted to the contact navigation surface 126. The reflected light signal is then received and detected by the image acquisition system 170. In the illustrated embodiment, the dual-channel optical navigation device 100 includes multiple navigation sensors, as described above. In one embodiment, the dual-channel optical navigation device 100 generates one or more electrical signals corresponding to incident light on one or more of the navigation sensors.

The dual-channel optical navigation device 100 then transmits the signals to the analog-to-digital converter 178. The analog-to-digital converter 178 converts the plurality of reconfigured electrical signals from analog signals to digital signals and then passes the digital signals to the digital signal processor 172.

After the digital signal processor 172 receives the digital form of the signals from the analog-to-digital converter 178 of the image acquisition system 170, the digital signal processor 172 may perform additional processing using the reconfigured electrical signals. The digital signal processor 172 then transmits one or more signals to the microcontroller 168. Exemplary types of signals transmitted from the digital signal processor 172 of the optical navigation circuit 166 to the microcontroller 168 include channel quadrature signals based on $\Delta x$ and $\Delta y$ relative displacement values. These signals, or other signals, may be indicative of a movement of the optical navigation device 162 relative to the contact navigation surface 126. Other embodiments of the digital signal processor 172 may transmit other types of signals to the microcontroller 168. In one embodiment, the microcontroller 168 implements a variety of functions, including transmitting data to and receiving data from a host computer system (not shown).

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A dual-channel optical navigation system, the system comprising:
   a circuit board to mechanically support and electrically connect multiple navigation sensors on opposing sides of the circuit board;
   a contact navigation sensor coupled to a first side of the circuit board, the contact navigation sensor to generate a contact navigation signal based on contact navigation images of a contact navigation surface approximately adjacent to the dual-channel optical navigation system; and
   a free-space navigation sensor coupled to a second side of the circuit board, the free-space navigation sensor to generate a free-space navigation signal based on free-space navigation images of an operating environment of the dual-channel optical navigation system.

2. The dual-channel optical navigation system of claim 1, further comprising a light source connected to the first side of the circuit board, the light source to illuminate the contact navigation surface.

3. The dual-channel optical navigation system of claim 2, wherein the light source comprises a light-emitting diode (LED), a vertical cavity surface-emitting laser (VCSEL), or a LED die.

4. The dual-channel optical navigation system of claim 1, further comprising a light pipe to transmit light along a contact navigation channel from the light source to the contact navigation surface by reflection of the light via a first reflective surface, wherein the first reflective surface is oriented at an angle to reflect the light at approximately a right angle and to redirect the light along a path of travel which is approximately normal to the contact navigation surface.

5. The dual-channel optical navigation system of claim 4, wherein the light pipe is further configured to direct the light reflected from the contact navigation surface to the contact navigation sensor by reflection via a second reflective surface, wherein the second reflective surface is oriented at an angle to reflect the light at approximately a right angle.

6. The dual-channel optical navigation system of claim 5, wherein the light pipe is further configured to direct the light reflected from the contact navigation surface toward the second reflective surface through the first reflective surface, wherein the first reflective surface is configured to reflect the light from the light source toward the contact navigation surface according to total internal reflection and to refract the light reflected from the contact navigation surface toward the second reflection surface.

7. The dual-channel optical navigation system of claim 4, further comprising:
    a housing to at least partially contain the circuit board, the contact navigation sensor, and the free-space navigation sensor; and
    a spacer to mount between the circuit board and the light pipe, wherein the spacer defines:
        a first aperture to pass the light from the light source to the first reflective surface of the light pipe; and
        a second aperture to pass the light reflected from the contact navigation surface and the second reflective surface to the contact navigation sensor.

8. The dual-channel optical navigation system of claim 1, further comprising a free-space lens to direct light corresponding to the free-space navigation images to the free-space navigation sensor.

9. The dual-channel optical navigation system of claim 1, wherein at least one of the contact and free-space navigation sensors comprises a complementary metal-oxide semiconductor (CMOS) class sensor.

10. The dual-channel optical navigation system of claim 1, wherein the circuit board is aligned approximately vertical relative to the contact navigation surface.

11. The dual-channel optical navigation system of claim 1, wherein the circuit board comprises a printed circuit board (PCB), and wherein the contact and free-space navigation sensors comprise pre-packaged integrated circuits (IC) bonded to the PCB.

12. The dual-channel optical navigation system of claim 1, wherein the circuit board comprises a printed circuit board (PCB), and wherein the contact and free-space navigation sensors comprise integrated circuit (IC) dies bonded to the PCB.

13. An optical navigation device, the device comprising:
    a circuit board to mechanically support and electrically connect multiple navigation sensors on opposing sides of the circuit board;
    a contact navigation sensor coupled to a first side of the circuit board, the contact navigation sensor to generate a contact navigation signal based on contact navigation images of a contact navigation surface approximately adjacent to the optical navigation device;
    a light source coupled to the first side of the circuit board, the light source to illuminate the contact navigation surface; and
    a light pipe to transmit the light from the light source to the contact navigation surface and to direct reflected light from the contact navigation surface to the contact navigation sensor.

14. The optical navigation device of claim 13, wherein the light pipe comprises:
    a first reflective surface to reflect the light from the light source to the contact navigation surface; and
    a second reflective surface to reflect the reflected light from the contact navigation surface to the contact navigation sensor;
    wherein the first reflective surface is further configured to refract the reflected light from the contact navigation surface toward the second reflective surface.

15. The optical navigation device of claim 13, wherein the navigation sensors comprise complementary metal-oxide semiconductor (CMOS) class sensors.

16. The optical navigation device of claim 13, further comprising a free-space navigation sensor coupled to the circuit board on a second side of the circuit board opposite the contact navigation sensor, wherein the free-space navigation sensor is configured to receive light from a free-space navigation lens and to generate a free-space navigation signal.

17. A method of making a dual-channel optical navigation system, the method comprising:
    mounting a contact navigation sensor to a first side of a circuit board, the contact navigation sensor to generate a contact navigation signal in a contact operation mode;
    mounting a light pipe to the first side of the circuit board, the light pipe to redirect light from a contact navigation surface approximately 90 degrees toward the contact navigation sensor; and
    mounting a free-space navigation sensor to a second side of the circuit board, the free-space navigation sensor to generate a free-space navigation signal in a free-space operation mode.

18. The method of claim 17, further comprising mounting a light source to the first side of the circuit board, the light source to illuminate the contact navigation surface via the light pipe, wherein the light pipe is further configured to redirect the light from the light source approximately 90 degrees toward the contact navigation sensor.

19. The method of claim 17, further comprising mounting a free-space lens structure to the second side of the circuit board approximately aligned with the free-space navigation sensor.

20. The method of claim 17, further comprising:
    mounting a housing to at least partially contain the circuit board, the contact navigation sensor, the light pipe, and the free-space navigation sensor; and
    mounting a structural spacer between the first side of the circuit board and the light pipe, wherein the structural spacer comprises:
        a first aperture to pass the light from the light source to a first reflective surface of the light pipe; and
        a second aperture to pass the redirected light from the contact navigation surface to the contact navigation sensor.

* * * * *